United States Patent
Schulze et al.

(10) Patent No.: US 8,779,509 B2
(45) Date of Patent: Jul. 15, 2014

(54) SEMICONDUCTOR DEVICE INCLUDING AN EDGE AREA AND METHOD OF MANUFACTURING A SEMICONDUCTOR DEVICE

(75) Inventors: Hans-Joachim Schulze, Taufkirchen (DE); Anton Mauder, Kolbermoor (DE); Franz Hirler, Isen (DE)

(73) Assignee: Infineon Technologies Austria AG, Villach (AT)

( * ) Notice: Subject to any disclaimer, the term of this patent is extended or adjusted under 35 U.S.C. 154(b) by 85 days.

(21) Appl. No.: 13/539,959

(22) Filed: Jul. 2, 2012

(65) Prior Publication Data
US 2014/0001547 A1    Jan. 2, 2014

(51) Int. Cl.
*H01L 21/14* (2006.01)

(52) U.S. Cl.
USPC .... 257/333; 257/339; 257/344; 257/E21.434; 257/E29.257; 257/E29.267

(58) Field of Classification Search
USPC .......................... 257/333–344, E21.041, 434, 257/29.242–267
See application file for complete search history.

(56) References Cited

U.S. PATENT DOCUMENTS

| | | | |
|---|---|---|---|
| 3,920,481 A * | 11/1975 | Hu | 438/227 |
| 4,108,686 A * | 8/1978 | Jacobus, Jr. | 438/291 |
| 5,047,812 A * | 9/1991 | Pfiester | 257/329 |
| 6,075,259 A * | 6/2000 | Baliga | 257/77 |
| 6,410,409 B1 * | 6/2002 | Gardner et al. | 438/526 |
| 6,410,958 B1 | 6/2002 | Usui et al. | |
| 6,972,436 B2 * | 12/2005 | Das et al. | 257/77 |
| 7,002,205 B2 | 2/2006 | Onishi et al. | |
| 2006/0240625 A1 * | 10/2006 | Loechelt et al. | 438/268 |
| 2010/0140694 A1 * | 6/2010 | Tu et al. | 257/333 |
| 2013/0126970 A1 * | 5/2013 | Bulucea et al. | 257/335 |
| 2014/0001552 A1 * | 1/2014 | Hirler et al. | 257/339 |
| 2014/0008717 A1 * | 1/2014 | Weber et al. | 257/329 |

FOREIGN PATENT DOCUMENTS

DE   102007046557 A1   4/2009

* cited by examiner

*Primary Examiner* — Michael Lebentritt
(74) *Attorney, Agent, or Firm* — Murphy, Bilak & Homiller, PLLC

(57) ABSTRACT

A semiconductor device includes a doped layer which contains a first dopant of a first conductivity type. In the doped layer, a counter-doped zone is formed in an edge area that surrounds an element area of the semiconductor device. The counter-doped zone contains at least the first dopant and a second dopant of a second conductivity type, which is the opposite of the first conductivity type. A concentration of the second dopant is at least 20% and at most 100% of a concentration of the first dopant. The dopants in the counter-doped zone decrease charge carrier mobility and minority carrier lifetime such that the dynamic robustness of the semiconductor device is increased.

15 Claims, 5 Drawing Sheets

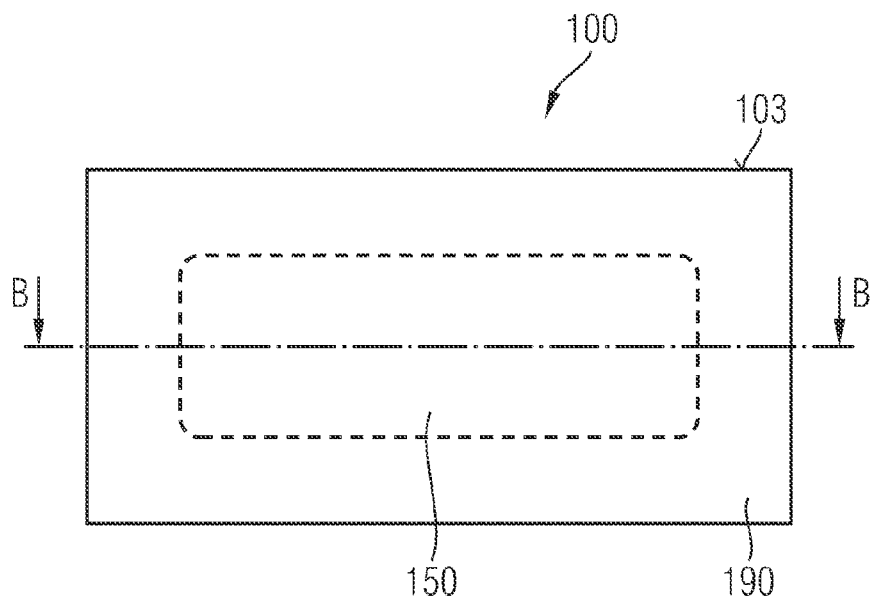
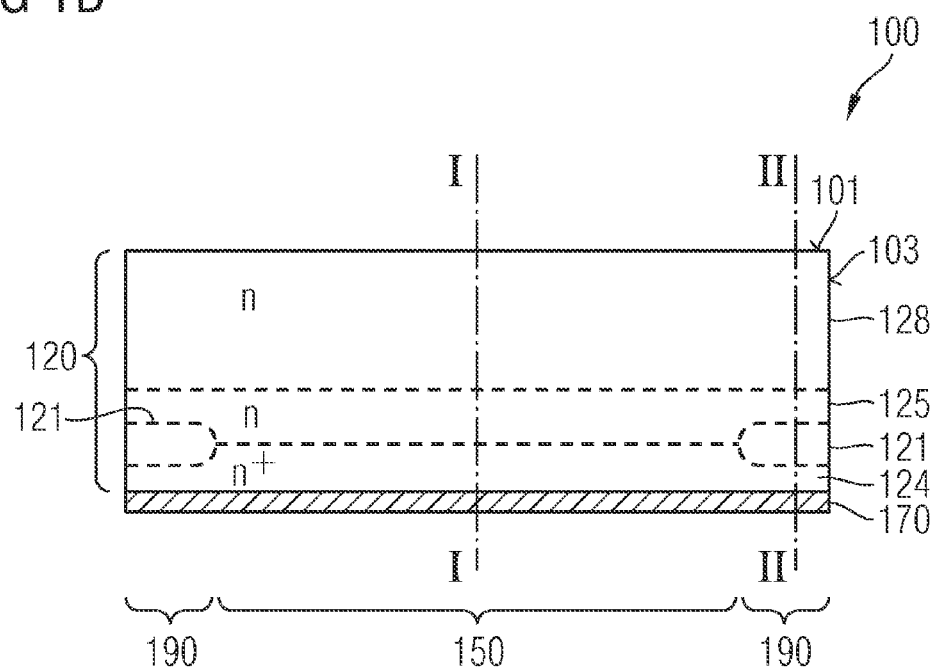

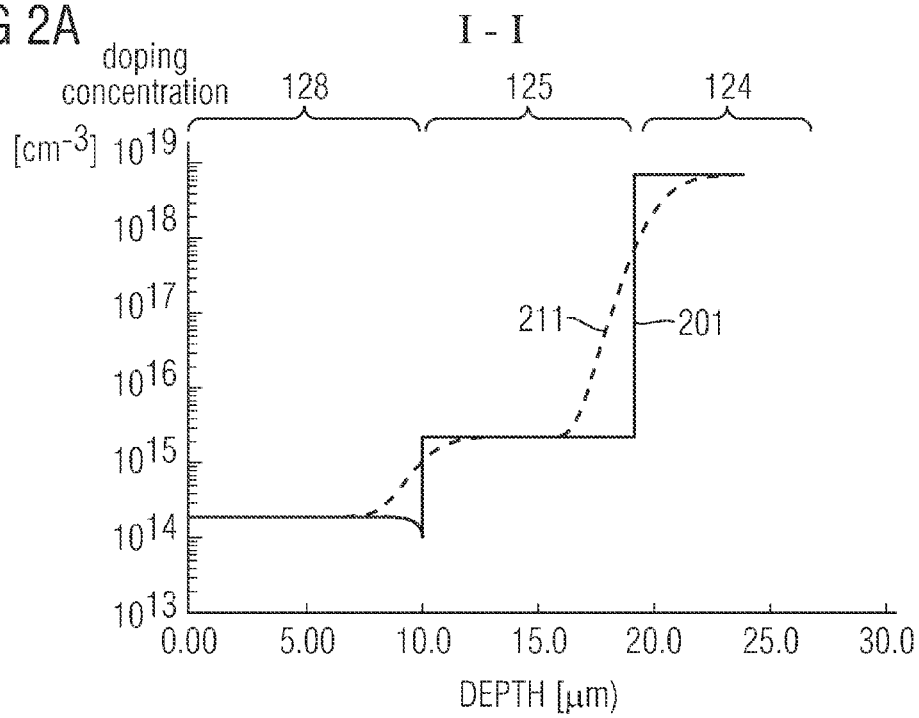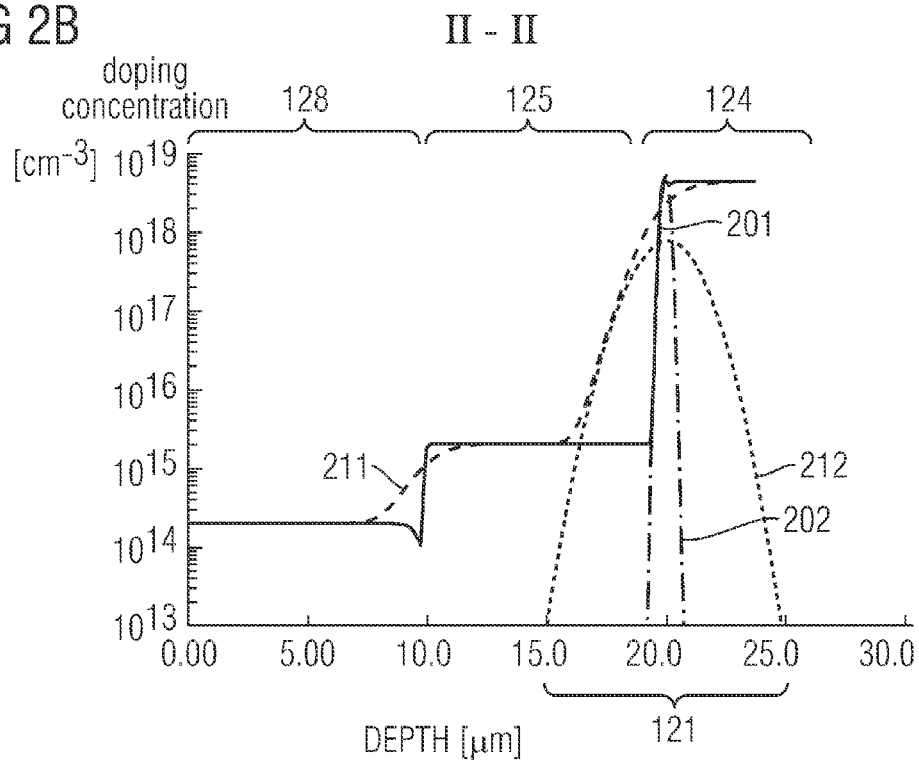

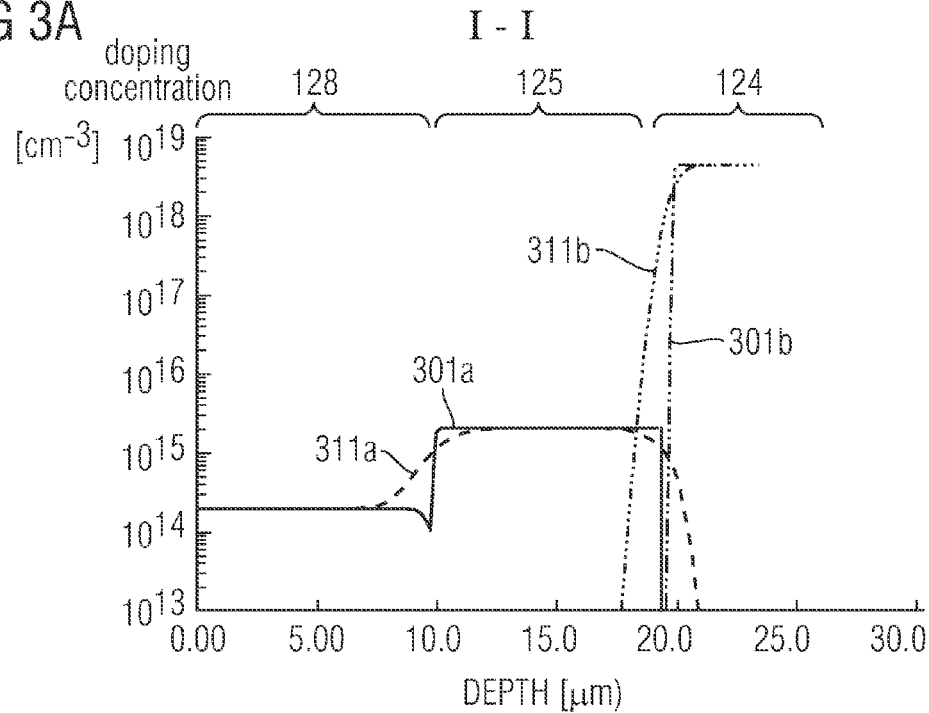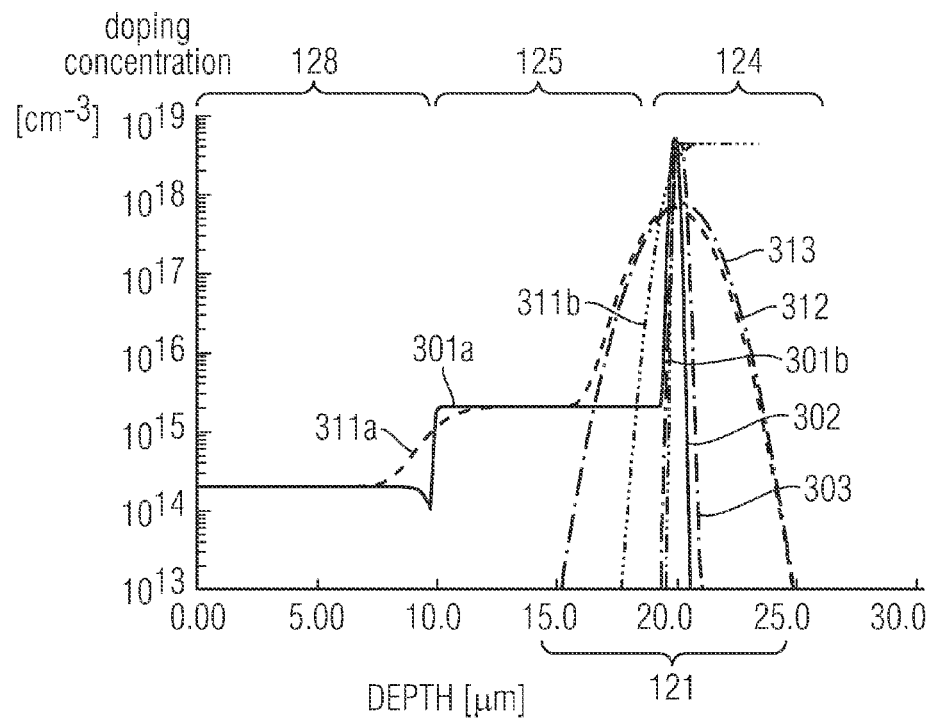

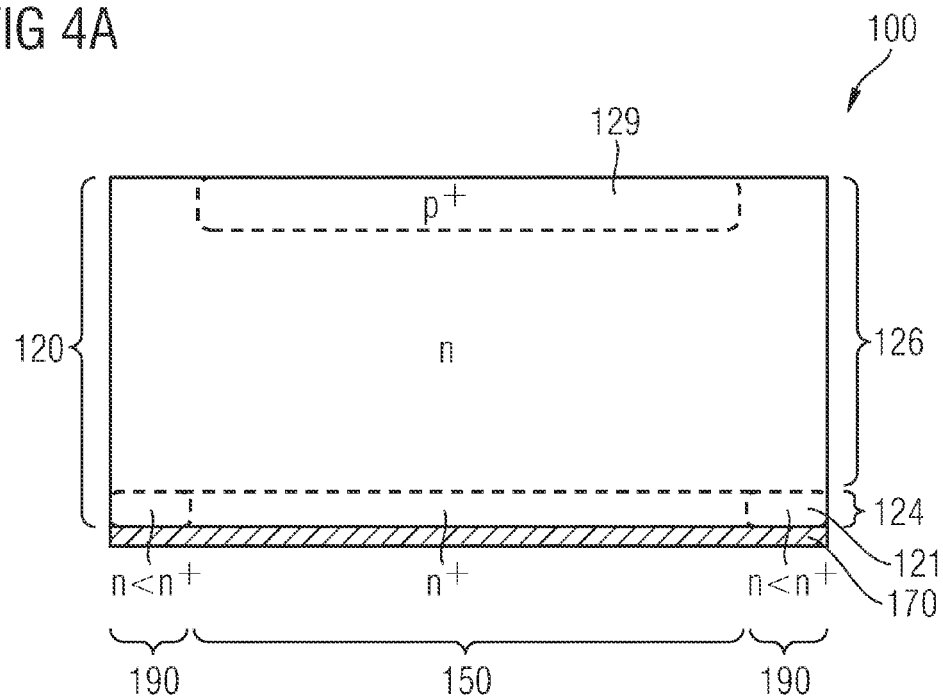
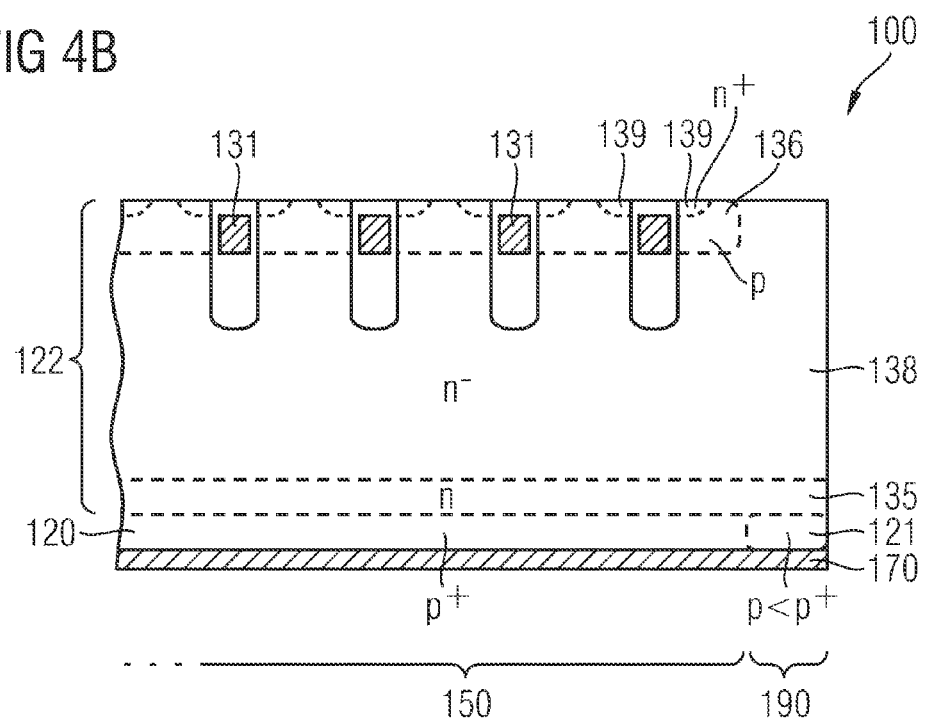

SEMICONDUCTOR DEVICE INCLUDING AN EDGE AREA AND METHOD OF MANUFACTURING A SEMICONDUCTOR DEVICE

BACKGROUND

Power semiconductor devices are used as switches in power electronic circuits for switching on and off loads supplied with high currents. Usually power semiconductor devices are able to carry a large amount of electric current in an "on"-state and to support a large reverse-bias voltage in an "off"-state.

It is desirable to improve the reliability of semiconductor devices.

SUMMARY

According to an embodiment, a semiconductor device includes a doped layer that contains a first dopant of a first conductivity type. In the doped layer, a counter-doped zone is formed in an edge area surrounding an element area of the semiconductor device. The counter-doped zone contains at least a first dopant of the first conductivity type and a second dopant of a second conductivity type, which is the opposite of the first conductivity type. Within the counter-doped zone, a concentration of the second dopant is at least 20% and at most 100% of a concentration of the first dopant.

According to another embodiment, a power IGFET (insulated gate field effect transistor) includes a doped layer containing first dopant elements of a first conductivity type. A counter-doped zone is formed in the doped layer in an edge area surrounding an element area of the semiconductor device, wherein the counter-doped zone contains at least the first dopant elements and second dopant elements of a second conductivity type which is the opposite of the first conductivity type. A concentration of the second dopant elements is at least 20% and at most 100% of a concentration of the first dopant elements.

According to an embodiment referring to a method of manufacturing a semiconductor device, a doped layer is provided. A counter-doped zone is formed in the doped layer in an edge area surrounding an element area of the semiconductor device. The counter-doped zone contains at least a first dopant of the first conductivity type and a second dopant of a second conductivity type which is the opposite of the first conductivity type. A concentration of the second dopant is at least 20% and at most 100% of the concentration of the first dopant.

Those skilled in the art will recognize additional features and advantages upon reading the following detailed description, and on viewing the accompanying drawings.

BRIEF DESCRIPTION OF THE DRAWINGS

The accompanying drawings are included to provide a further understanding of the invention and are incorporated in and constitute a part of the specification. The drawings illustrate the embodiments of the present invention and together with the description serve to explain principles of the invention. Other embodiments of the invention and intended advantages will be readily appreciated as they become better understood by reference to the following detailed description. The elements of the drawings are not necessarily to scale relative to each other. Like reference numerals designate corresponding similar parts.

FIG. 1A is a schematic top view on a semiconductor device including an edge area and an element area in accordance with an embodiment of the invention.

FIG. 1B is a schematic cross-sectional view of the semiconductor device of FIG. 1A.

FIG. 2A is a diagram showing dopant profiles along line I-I in an element area of the semiconductor device of FIG. 1B in accordance with an embodiment referring to doped epitaxial layers on a highly doped substrate layer.

FIG. 2B is a diagram showing the dopant profiles along line II-II in an edge area of the semiconductor device of FIG. 1B.

FIG. 3A is a schematic diagram showing dopant profiles along line I-I in an element area of the semiconductor device of FIG. 1B in accordance with an embodiment related to an arsenic-doped substrate layer.

FIG. 3B is a schematic diagram showing dopant profiles along line II-II in an edge area of the semiconductor device of FIG. 1B in accordance with the embodiment related to an arsenic-doped substrate layer.

FIG. 4A is a schematic cross-sectional view of a semiconductor device including a diode and a counter-doped zone in accordance with a further embodiment.

FIG. 4B is a schematic cross-sectional view of a semiconductor device including an insulated gate bipolar transistor and a counter-doped zone in accordance with a further embodiment.

DETAILED DESCRIPTION

Figure 5:
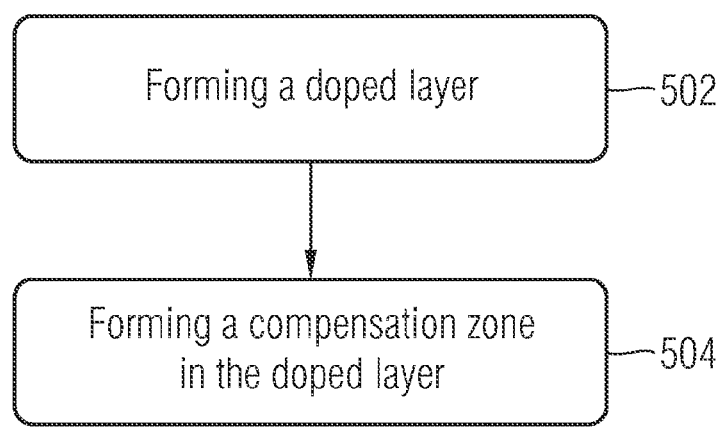
FIG. 5 is a simplified flow-chart of a method of manufacturing a semiconductor device in accordance with another embodiment.

In the following detailed description, reference is made to the accompanying drawings, which form a part hereof, and in which are shown by way of illustrations specific embodiments in which the invention may be practiced. It is to be understood that other embodiments may be utilized and structural or logical changes may be made without departing from the scope of the present invention. For example, features illustrated or described for one embodiment can be used on or in conjunction with other embodiments to yield yet a further embodiment. It is intended that the present invention includes such modifications and variations. The examples are described using specific language which should not be construed as limiting the scope of the appending claims. The drawings are not scaled and are for illustrative purposes only. For clarity, the same elements or manufacturing processes have been designated by the same references in the different drawings if not stated otherwise.

The terms "having", "containing", "including", "comprising" and the like are open and the terms indicate the presence of stated elements or features but not preclude additional elements of features. The articles "a", "an" and "the" are intended to include the plural as well as the singular, unless the context clearly indicates otherwise.

The Figures illustrate relative doping concentrations by indicating "−" or "+" next to the doping type "n" and "p". For example "n$^-$" means a doping concentration which is lower than the doping concentration of an "n"-doping region while an "n$^+$"-doping region has a higher doping concentration than an "n"-doping region. Doping regions of the same relative doping concentration do not necessarily have the same absolute doping concentration. For example, two different "n"-doping regions may have the same or different absolute doping concentrations.

FIG. 1A shows a semiconductor die 100 of a semiconductor device with an edge area 190 surrounding an element area 150. The edge area 190 extends directly along an edge of the semiconductor die 100 between the element area 150 and a singulation surface 103 and may have a width of at least some 10 micrometers or more than 100 micrometers, depending on a desired device voltage blocking capability. Within the edge area 190 edge termination elements may be formed to shape an electric field gradient in the edge area 190 resulting in lower maximum electrical field intensities.

The element area 150 may include one or more semiconductor elements defining the function of the semiconductor device, for example a diode, a bipolar transistor, a JFET (junction field effect transistor), an IGFET, for example an MOSFET (metal oxide semiconductor field effect transistor) in the usual meaning including FETs with metal and with non-metal gate electrodes, or an IGBT (insulated gate bipolar transistor), wherein each transistor may include a plurality of transistor cells arranged in cell arrays. The MOSFETS may be super-junction MOSFETs based on a compensation effect using, for example, successively arranged p-doped and n-doped columns for improving the voltage blocking capability of the drift zone. Regarding MOSFETs and IGBTs, the source/emitter and body zones as well as gate electrode structures may be formed in the element area 150. As regards diodes, the anode region may be formed in the element area 150. Further semiconductor elements in the element area 150 may be logic circuits, driver circuits, processor circuits or memory circuits.

The element area 150 may have sharp corners. According to the illustrated embodiment, the element area 150 has rounded corners. The semiconductor die 100 may be formed from a monocrystalline semiconductor substrate, for example a monocrystalline silicon wafer, and may include further doped and undoped sections, epitaxial semiconductor layers and previously fabricated insulating structures.

According to the cross-sectional view illustrated in FIG. 1B, the semiconductor die 100 includes a doped layer 120 containing a first dopant of a first conductivity type. At least a part of a counter-doped zone 121 is formed in the edge area 190 of the doped layer 120. In addition to the first dopant, the counter-doped zone 121 contains a second dopant of a second conductivity type which is the opposite of the first conductivity type, wherein within the counter-doped zone 121 a concentration of the second dopant is at least 20% and at most 100% of a concentration of the first dopant.

According to an embodiment, the first conductivity type is the n-type and the second conductivity type is the p-type. For example, the first dopant is arsenic or phosphorus and the second dopant is boron, gallium, aluminum or indium. According to other embodiments, the first conductivity type is the p-type and the first dopant is boron, gallium, aluminum or indium, whereas the second dopant is arsenic or phosphorus.

In conventional power semiconductor devices dynamic effects in the edge area 190 may result in locally increased current densities. For example, at a front side of the semiconductor die increased current densities caused by holes may lead to a dynamic avalanche effect reducing the reverse dielectric strength. At a backside of the semiconductor device an increased electron current density in the area of a highly doped backside emitter or drain zone may flip the electrical field, which may also result in reduced reverse dielectric strength.

Instead, according to the embodiments, the effective net dopant concentration is reduced in the edge area 190. The resulting reduced emitter efficiency in turn results in lower current densities in the edge area 190. Further, the additional dopant in the counter-doped zone 121 reduces both charge carrier mobility and minority carrier lifetime in the edge area 190. As a result, in the on-state of an inverse diode formed in the element area 150 of the semiconductor die 100, the injection of free charge carriers is reduced and undesired dynamic effects in the edge area 190 can be avoided that may be destructive for the semiconductor device. The local counter doping in the edge area 190 increases the dynamic robustness of the semiconductor elements formed in the element area 150.

The counter-doped zone 121 may be formed in a portion of the edge area 190, for example along a section of one of the four edges of a rectangular semiconductor die 100, along sections of two, three or four edges or may extend along one, two, three or four complete edges. According to an embodiment, the counter-doped zone 121 may be formed in a circumferential portion of the edge area 190 directly adjoining to the edge of the semiconductor die 100 or in a portion offset to the edge. According to another embodiment, the counter-doped zone 121 is formed approximately in the total edge area 190. The counter-doped zone 121 may extend to some degree into the element area 150. According to another embodiment, the counter-doped zone 121 is not formed in the element area 150 such that the device efficiency is not decreased in the element area 150. The counter-doped zone 121 may reach the singulation surface 103 of the semiconductor die 100. According to another embodiment, the counter-doped zone 121 does not reach the singulation surface 103 of the semiconductor die 100.

For each portion within the counter-doped zone 121 a concentration of the second dopant is at least 20% of that of the first dopant in order to obtain a significant effect. According to other embodiments, the concentration of the second dopant is at least 50%, for example at least 90% or close to but not exceeding the concentration of the first dopant in order to maximize scattering and recombination of charge carriers in the counter-doped zone 121. According to an embodiment, the second dopant compensates for the first dopant by at least 20% and at most 100%. According to an embodiment, the compensation is approximately complete, however, any local overcompensation is avoided.

The doped layer 120 may include further portions of the first and second conductivity type. For example, according to an embodiment related e.g. to MOSFETS, diodes or IGFETs, the doped layer 120 may include a field stop zone 125 of the first conductivity and a drift zone 128 of the first conductivity type, wherein the drift zone 128 has a lower net dopant concentration than the field stop zone 125. For example, the net dopant concentration in the field stop zone 125 is at least ten times higher than in the drift zone 128. In the drift zone 128, body regions of the second conductivity type and source regions of the first conductivity type may be formed as wells respectively.

The doped layer 120 may further include a highly doped substrate layer 124 arranged in direct contact with the field stop zone 125. For example, the net dopant concentration in the substrate layer 124 is at least ten times higher than in the field stop zone 125. The substrate layer 124 and the field stop zone 125 may form a common interface along which the counter-doped zone 121 is formed in the edge area 190. The counter-doped zone 121 may extend into the substrate layer 124. According to embodiments without field stop zone, the substrate layer 124 may directly adjoin the drift zone 128. The substrate layer 124 and the drift zone 128 may form a common interface along which the counter-doped zone 121 is formed in the edge area 190. The counter-doped zone 121 may extend into the substrate layer 124. Alternatively, the counter-doped zone 121 may be restricted to the substrate layer 124 in both cases. The substrate layer 124 may be of the same conductivity type as the doped layer 120.

A backside metallization 170 may be formed at a surface of the substrate layer 124 which is opposite to the drift and field stop zones 128, 125. The backside metallization 170 is electrically connected to the drift zone 128 in the doped layer 120 through the substrate layer 124, which in case of MOSFETs, diodes or IGFETs is highly doped and of the same conductivity type as the drift zone 128. In the edge area 190, the counter-doped zone 121 is formed between the drift zone 128 in the doped layer 120 and the backside metallization 170. According to an embodiment, the counter-doped zone 121 may extend from the drift zone 128 to the backside metallization 170. According to other embodiments, the counter-doped zone 121 is formed only in the field stop zone 125, only in the substrate layer 124, or in portions of both the field stop zone 125 and the substrate layer 124. According to an embodiment, the counter-doped zone 121 may be formed only in the drift zone 120, or in portions of both the drift zone 120 and the field stop zone 125 or the substrate layer 124, respectively. FIGS. 2A and 2B show dopant profiles along lines I-I and II-II of FIG. 1B in accordance with an embodiment related to step-wisely doped epitaxial layers.

FIG. 2A shows the dopant profiles of a first dopant through an element area 150 in a direction vertical to a planar interface between the doped layer 120 and the substrate layer 124. The substrate layer 124 may have an initial dopant concentration greater than $10^{17}$ cm$^{-3}$, for example about $5 \times 10^{18}$ cm$^{-3}$ or even higher. A first sub-layer 125 of the doped layer 120 is an epitaxial layer with a uniform initial concentration that is lower than that of the substrate layer 124, for example $2 \times 10^{15}$ cm$^{-3}$. A second sub-layer 128 of the doped layer 120 is an epitaxial layer having a uniform initial dopant concentration that is lower than that of first sub-layer 125, for example $10^{14}$ cm$^{-3}$. The second sub-layer 128 may form a drift zone and the first sub-layer 125 a field stop zone. The dopant profile 201 gives the initial dopant concentration profile. The dopant in the substrate layer 124 is the same as in the first sub-layer 125, for example phosphorus. The final dopant profile 211 results from the initial dopant profile 201 after applying a thermal anneal at high temperatures, e.g. 1150 degree Celsius for 200 minutes. During the anneal dopant elements diffuse from higher-doped regions to lower lower-doped regions such that the dopant profile gets smoother. According to an embodiment, the initial dopant concentration of the first sub-layer 125 and/or the second sub-layer 128 is not uniform but may vary in the direction towards the substrate layer 124.

FIG. 2B shows the dopant profiles in the edge area 190. In addition to the dopant profiles 201, 211 of FIG. 2A, FIG. 2B shows an initial dopant profile 202 for a second dopant of the second conductivity type resulting from implanting boron at the interface between the doped layer 120 and the substrate layer 124 with an area density of $2 \times 10^{14}$ cm$^{-2}$ and an implant energy of 45 keV in the edge area 190. The final dopant profile 212 for the second dopant results after the thermal anneal. The initial dopant concentration 212 of boron is selected such that no overcompensation of the first dopant occurs after the anneal. The conductivity type of the counter-doped zone 121 remains the same as in the neighboring areas of the doped layer 120. The effective net dopant concentration is reduced. The resulting reduced emitter efficiency in turn results in lower current densities in the edge area 190.

The implant of the second dopant may be performed before the field stop zone 125 and the drift zone 128 are epitaxially grown on the substrate layer 124. A high temperature process, e.g. an RTA (rapid thermal annealing) process or a laser process may be used to anneal implant damages caused by the second dopant prior to the epitaxial deposition. An oxidation process may be performed to cure implant damages occurring at high implant doses, wherein the grown oxide is removed before further portions of the doped layer 120 are grown on the substrate layer 124. According to an embodiment, the first dopant is phosphorus and the second dopant is boron such that the similar diffusion properties of boron and phosphorus can be used to avoid a local overcompensation as illustrated in FIG. 2B.

FIGS. 3A and 3B relate to an embodiment using a substrate layer 124 containing a third dopant and show dopant profiles along lines I-I and II-II in FIG. 1B. According to FIG. 3A, the substrate layer 124 shows an initial dopant profile 301b of arsenic with a uniform initial dopant concentration of about $5 \times 10^{18}$ cm$^{-3}$ corresponding to an electrical resistivity of about 10 mΩcm. Further in the element area 150, the further portions of the doped layer 120 include a first sub-layer 125 directly adjoining to the substrate layer 124 and having an initial uniform dopant concentration of a first dopant of about $2 \times 10^{15}$ cm$^{-3}$ and a second sub-layer 128 having a uniform initial dopant concentration of the first dopant of about $10^{14}$ cm$^{-3}$. After a thermal anneal for 200 minutes at 1150 degree Celsius the final dopant profile 311a for phosphorus and the final dopant profile 311b for arsenic result from the initial dopant profiles 301a, 301b. According to an embodiment, the initial dopant concentration of the first sub-layer 125 and/or the second sub-layer 128 is not uniform but may vary in the direction towards the substrate layer 124.

FIG. 3B shows the final dopant profiles in the edge area 190. The initial and final dopant profiles 301a, 301b, 311a, 311b correspond to those of FIG. 3A. Further, for forming the counter-doped zone 121, an initial doping profile 303 for a second dopant, for example boron, is generated using an implant of $2 \times 10^{14}$ cm$^{-2}$ boron and an implantation energy of 80 keV. After the thermal anneal, a final dopant profile 313 results for boron. Since the diffusion length of boron is greater than that of arsenic, the boron may overcompensate the arsenic at a certain distance to the substrate layer 124.

An additional implant of a dopant having the same conductivity type as arsenic may be used to avoid a local overcompensation. For example, phosphorus is implanted with an implant dose of $2 \times 10^{14}$ cm$^{-2}$ at an implantation energy of 45 keV at the interface between the substrate layer 124 and further portions of the doped layer 120 as shown with initial doping profile 302. Due to the similar diffusion properties of phosphorus and boron, after an anneal the final dopant profile 312 for the first dopant, which is phosphorus, approximates that of the second dopant, which is boron.

As illustrated in FIG. 3B, the phosphorus and the boron implants may compensate each other after the anneal such that a local overcompensation of arsenic is reliably avoided. A total concentration of the first and third dopants is higher than the concentration of the second dopant in the counter-doped zone 121. The additional phosphorus implant increases scattering and recombination of charge carriers which results in reduced charge carrier mobility and minority carrier lifetime in the edge area 190.

Where the embodiments of FIGS. 3A and 3B combine a combined phosphorus/boron implant with an arsenic substrate layer, other embodiments may provide both implants in combination with another substrate layer to make use of the reduction of charge carrier mobility and minority carrier lifetime.

The embodiments provide local reduction of the injection of free charge carriers in the edge area by a local compensation-like implant in order to increase the dynamic robustness of semiconductor devices.

According to other embodiments, formation of the counter-doped zone 121 may be combined with the formation of a field stop zone in the doped layer 120 both in the edge area 190 and the element area 150 without an epitaxy process providing different doping concentrations. For example, a field stop zone may be provided by increasing a local phosphorus concentration with reference to a local boron concentration or by providing a significantly higher implant energy for boron than for phosphorus. The resulting dopant profile may result in a field stop zone showing a dopant concentration level which is high compared to a field stop zone formed from an epitaxially grown layer.

A dopant concentration in the field stop zone in the range of $10^{15}$ cm$^{-3}$ to $10^{16}$ cm$^{-3}$ or higher shifts the start of charge carrier generation at the n/n$^+$ interface to higher current densities.

FIG. 4A refers to an embodiment related to a diode. A semiconductor die 100 includes a doped layer 120 with a highly n$^+$ doped first sub-layer 124 and a second sub-layer 126 having a lower n dopant concentration than the first sub-layer 124. A highly p$^+$ doped anode region 129 is formed in a surface of the doped layer 120 which is opposite to the first sub-layer 124. The anode region 129 may form a well in a distance to an edge of the semiconductor die 100. The highly p$^+$ doped anode region 129 may define an element area 150 which is surrounded by an edge area 190. Typically, an anode metallization is provided in direct contact with the anode region 129.

A counter-doped zone 121 may be formed in the edge area 190 of the first sub-layer 124. In the counter-doped zone 121, a counter implant may partially compensate for the n+ implant of the first sub-layer 124 such that the effective net dopant concentration in the counter-doped zone 121 is lower than in portions of the first sub-layer 124 outside the counter-doped zone 121. According to other embodiments two dopants of opposite conductivity type may be additionally implanted into the counter-doped zone 121 such that the effective net dopant concentration remains approximately the same, whereas the absolute dopant concentration is increased.

A portion of the second sub-layer 126 is of the first conductivity type and forms a drift zone in the doped layer 120. A backside metallization 170 may be formed at a surface of the first sub-layer 124 which is opposite to the second sub-layer 126. The backside metallization 170 is electrically connected to the n doped drift zone in the second sub-layer 126 through the highly doped first sub-layer 124. The first sub-layer 124 may be a substrate portion on which further sub-layers like the second sub-layer 126 are epitaxially grown. In the edge area 190, the counter-doped zone 121 is formed between the n doped drift zone in the second sub-layer 126 and the backside metallization 170. Alternatively, a further sub-layer between the first and second sub-layers 124, 126 may provide a field stop zone having a net dopant concentration that is higher than in the second sub-layer 126 and lower than in the first sub-layer 124, wherein at least part of the counter-doped zone 121 is formed in the field stop zone. According to another embodiment, the counter-doped zone 121 is restricted to the first sub-layer 124 forming a substrate portion, or a field stop zone provided between the first and second sub-layers 124, 126. According to an embodiment, the second sub-layer 126 may be provided by a low doped semiconductor bulk material and the first sub-layer 124 and the highly doped layer 120 may be provided by doping processes, e. g. by at least an ion implantation and at least an annealing process.

FIG. 4B refers to an embodiment related to an IGBT. A doped layer 120 of a semiconductor die 100 forms a highly p$^+$ doped collector zone. A further doped layer 122 is provided in direct contact with the doped layer 120. In the further doped layer 122 an n$^-$ doped drift zone 138 is formed. According to an embodiment, an n doped field stop zone 135 may be formed in the further doped layer 122 between the doped layer 120 and the n$^-$ doped drift zone 138. In an element area 150, n$^+$ doped emitter zones 139 are formed, wherein a p– doped body zone 136 separates the emitter zones 139 and the drift zone 138. A potential applied to gate electrodes 131, which may be arranged in trenches extending through the body zone 136, control a current through the body zone 136.

In an edge area 190 extending along an edge of the semiconductor die 100, a counter-doped zone 121 is formed within the doped layer 120. For example, if the doped layer includes a field stop zone, the counter-doped zone 121 may extend into the field stop zone. In the counter-doped zone 121, a counter implant may partially compensate for the p$^+$ doping of the first sub-layer 124 such that the effective dopant concentration in the counter-doped zone 121 is lower than in sections of the doped layer 120 outside the counter-doped zone 121 and the injection effectivity of the collector is reduced in the edge area 190. According to other embodiments two dopants of opposite conductivity type may be additionally implanted into the counter-doped zone 121 such that the effective net dopant concentration remains approximately the same, whereas the absolute dopant concentration is increased, increased scattering reduces charge carrier mobility and an increased recombination rate reduces minority carrier lifetime in the edge area 190.

A backside metallization 170 may be formed at a surface of the doped layer 120 which is opposite to the further doped layer 122. The backside metallization 170 directly adjoins the doped layer 120 and is electrically connected to the doped layer 120. In the edge area 190, the counter-doped zone 121 is formed between the drift zone 138 in the further doped layer 122 and the backside metallization 170.

FIG. 5 refers to a method of manufacturing a semiconductor device. A doped layer may be provided which contains a first dopant of a first conductivity type (502). Then a counter-doped zone is formed in the doped layer in an edge area surrounding an element area of the semiconductor device. The counter-doped zone contains at least the first dopant of the first conductivity type and a second dopant of a second conductivity type which is the opposite of the first conductivity type. A concentration of the second dopant is at least 20% and at most 100% of a concentration of the first dopant (504). A masked implant may be used to implant the second dopant of the second conductivity type in the edge area at a concentration which is lower than the usual concentration of the first dopant of the first conductivity type. The implant may be activated by a thermal annealing step, a laser induced melting or fusing process. According to an embodiment, the second dopant is boron and the first doping is phosphorous. According to an embodiment, the boron implant is activated contemporaneously with the activation of a phosphorus-doped emitter zone on the backside of the semiconductor device.

According to embodiments related to power MOSFETs, the implant(s) provided for generating the counter-doped zone may be performed on a surface of a substrate layer, on which the doped layers are epitaxially grown.

According to embodiments related to IGBTs, the be performed in a collector layer formed in or adjacent to a substrate layer.

Forming the counter-doped zone may include performing a co-implantation using the second dopant of the second conductivity type and a further dopant of the first conductivity type, wherein the dopant concentrations of the second and the further dopants are equal or approximately equal. For example, the implants for the second and the further dopants may be performed contemporaneously. According to an embodiment, an auxiliary implant is performed using molecules containing the same number of donor and acceptor ions or elements. Charge carrier mobility and minority carrier lifetime are reduced, whereas a predetermined net dopant concentration given by the concentration of the first dopant is maintained. implant(s) provided for generating the counter-doped zone may Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a doped layer containing a first dopant of a first conductivity type; and
   a counter-doped zone formed in the doped layer in an edge area surrounding an element area of the semiconductor device, wherein the counter-doped zone contains at least the first dopant and a second dopant of a second conductivity type which is the opposite of the first conductivity type, wherein a concentration of the second dopant is at least 20% and at most 100% of a concentration of the first dopant.

2. The semiconductor device according to claim 1, wherein a doping compensation of the doping of the first dopant by the second dopant is at least 20% and at most 100%.

3. The semiconductor device according to claim 1, wherein the counter-doped zone is not formed in the element area.

4. The semiconductor device according to claim 1, wherein source regions of transistor cells are formed in a portion of the doped layer in the element area.

5. The semiconductor device according to claim 1, wherein an anode region of a diode is formed in a portion of the doped layer in the element area.

6. The semiconductor device according to claim 1, wherein the first dopant is phosphorus and the second dopant is boron.

7. The semiconductor device according to claim 1, wherein the doped layer comprises a field stop zone and a drift zone directly adjoining the field stop zone, wherein a net dopant concentration in the field stop zone is higher than in the drift zone, and wherein the counter-doped zone is formed completely or in parts in the field stop zone.

8. The semiconductor device according to claim 1, wherein the doped layer comprises a drift zone, a field stop zone directly adjoining the drift zone, and a substrate layer directly adjoining the field stop zone on a side of the field stop zone opposing the drift zone, wherein a net dopant concentration in the field stop zone is higher than in the drift zone and a net dopant concentration in the substrate layer is higher than in the field stop zone, and wherein the counter-doped zone is formed completely or in parts in the substrate layer.

9. The semiconductor device according to claim 8, wherein the substrate layer contains a third dopant of the first conductivity type and the counter-doped zone in the doped layer contains the first and second dopants, and wherein a total concentration of the first and third dopants is higher than the concentration of the second dopant in the counter-doped zone.

10. The semiconductor device according to claim 9, wherein the first dopant is phosphorus, the second dopant is boron, and the third dopant is arsenic.

11. The semiconductor device according to claim 1, wherein a portion of the doped layer is an epitaxial layer.

12. The semiconductor device according to claim 8, further comprising a backside metallization electrically connected to the drift zone, wherein in the edge area the counter-doped zone is formed between the drift zone and the backside metallization.

13. The semiconductor device according to claim 1, further comprising a drift zone of the second conductivity type formed in a further doped layer directly adjoining to the doped layer that includes the counter-doped zone.

14. The semiconductor device according to claim 13, further comprising a backside metallization electrically connected to the doped layer and the counter-doped zone, wherein in the edge area the counter-doped zone is formed between the drift zone and the backside metallization.

15. A power insulated gate field effect transistor, comprising:
   a doped layer containing first dopant elements of a first conductivity type; and
   a counter-doped zone formed in the doped layer in an edge area surrounding an element area of the semiconductor device, wherein the counter-doped zone contains at least the first dopant elements and second dopant elements of a second conductivity type which is the opposite of the first conductivity type, wherein a concentration of the second dopant elements is at least 20% and at most 100% of a concentration of the first dopant elements.

* * * * *